United States Patent [19]

Han

[11] Patent Number: 5,452,257
[45] Date of Patent: Sep. 19, 1995

[54] ADDRESS RANGE BANK DECODING FOR DRAM

[75] Inventor: Wen C. Han, Taiwan, Hong Kong

[73] Assignee: United Microelectronics Corp.

[21] Appl. No.: 302,159

[22] Filed: Sep. 8, 1994

[51] Int. Cl.$^6$ ............................................. G11C 13/00
[52] U.S. Cl. .............................. 365/230.03; 365/238.5
[58] Field of Search ................ 365/45, 189.01, 189.04, 365/230.01, 230.03, 238.5

[56] References Cited

U.S. PATENT DOCUMENTS 5,134,589  7/1992  Hamano ........................... 365/238.5

Primary Examiner—Terrell W. Fears
Attorney, Agent, or Firm—Dykema Gossett

[57] ABSTRACT

A method of decoding a memory bank in a DRAM controller system is described that includes obtaining an access address of the bank, defining a begin address of the bank, defining an end address of the bank, and comparing the begin and the end addresses with the access address. A DRAM controller system bank decoding circuit is also disclosed comprising a first comparator for the access address of the bank and the end address of the bank, with an output of the first comparator, corresponding to the access address being less than the end address, connected to a first input of an AND logic gate, a second comparator comparing the access address with the begin address of the bank, with an output of the second comparator, corresponding to the access address being larger than or equal to the begin address, connected to a second input of an AND logic gate.

3 Claims, 2 Drawing Sheets

ADDRESS RANGE BANK DECODING FOR DRAM

FIELD OF THE INVENTION

The present invention generally relates to a computer technique of Dynamic Random Access Memory (DRAM) controller system and more particularly is related to a bank decoding means for a DRAM controller system.

BACKGROUND OF THE INVENTION

Digital information technology is based on storing data items and sequences of commands that will process the data items stored inside a digital system in a subunit called 'memory'. The memory units belong to different kinds based on the type of technology and the nature of accessing locations within a memory unit. The smallest amount of data that can be stored is a binary digit or a "bit". Data items such as integers, real numbers, ASCII characters are represented in terms of bits. A bit has only two values, 0 and 1. Historically, either magnetic fields or electrical signals can be used to represent these two values. A memory unit has a size representing the number of distinct locations, and each location has an address. The number of bits that constitute the content of a memory word is known as the word length.

A memory unit is classified as a "Random Access Memory" (RAM) or a "Sequential Access Memory" depending on whether accessing a word takes a source time no matter where the word is located or whether a sequential search of all previous locations is involved to reach the desired location, respectively. Semiconductor memory with decoding mechanisms is a RAM, and memory units such as tape drives, bubble memory, charge-coupled devices (CCD) are examples of sequential access memory units.

RAM memories are also called read/write memories (RWM) because we can read a word from a location in RAM and we can also write a word to a location in RAM. In contrast, a ROM is a read-only memory. We cannot perform a write operation routinely in a ROM.

A RAM being a read/write memory, should retain the data stored indefinitely without a power supply. Such a RAM is called a nonvolatile memory. The magnetic core memories of the previous decades are nonvolatile memories, but the read/write access is very slow for these memories. A static RAM (SRAM) is a RAM that retains the data so long as the power supply is not disconnected. Most semi-conductor RAM units fall into this category.

A "Dynamic RAM" (DRAM) is a unit where the unit not only needs a power supply, but also the contents of all memory locations will have to be refreshed at regular intervals of time, for otherwise the electrical signal representing data bits will degenerate and no longer represent the correct data. The main reason why a DRAM is designed is because takes only one transistor (FET) and a capacitor to store a bit unlike a semiconductor memory where a bistable flip-flop consisting of four to six transistors is required to store one bit. In high density CMOS VLSI design, we can save a great deal of money and space by using DRAMS. A price is paid for this savings by requiring that a refreshing pulse continuously sweep the DRAM, refreshing the memory contents at regular intervals of time. Refreshing always involves reading the degenerated data at a location, and writing the source value afresh back at that location. No read or write access of this location is allowed when refreshing a location. Refreshing is necessary due to the decay of charge across a capacitor.

Nowadays DRAM chips are available with capacities in range of 16 to 64 megabits. The word length is usually one or two bits and may be extended to any length theoretically. The number of address lines correspond to the number of locations and to the length of the basic addressable word. For example, 16 megabits with one bit per word in one chip will need 22 address lines to address each location. If we need 16 megaword memory, each word with a length 16, then we can use 16 of these chips and connect them in parallel to increase the word length to 16. Word length has no direct bearing on the addressability of a word. However, chips with longer word lengths will need more data pins, more complicated buffers and other circuitry. At high densities, the manufacturing process also becomes more unreliable, cutting down on the net yield. It is for this reason that the cost associated with wide DRAM is rather high.

Refreshing of the data is seldom done on cell by cell basis. RAM locations are logically organized in a number of rows and usually an equal number of columns. For example, in a $16 \times 1$ megabit DRAM, there will be 2048 rows and that many columns. The address is broken into two halves, and the row value is given to a row decoder. There is a RAS pulse to access a row (for 'row address strobe'), and a CAS pulse to access a column (for 'column address strobe'). When a row is selected, the complete row is refreshed at one time. This requires only 2048 refreshing, rather than 16 mega refreshings.

The two most important operations on a DRAM are reading and writing. For the both operations, the address of the location is placed in the address register. For reading, "read enable" (RE) is activated and the contents of the entire row are latched into a row latch. The column bits of the address register are then used to identify the column. The bit value at the selected column will be placed onto the output data line. This value is also written back at the source location as 'read' is always destructive. For write operation, output data line is disabled, input data line is enabled, "write enable" (WE) is asserted and then CAS is asserted. The value at the input data line will be written at the correct location.

Different manufacturers use different techniques to refresh the memory. In some chips, an internal counter is used to count the row being currently refreshed. Counter value is incremented after each refreshing and the process continues. In some other chips, the address of the row to be refreshed is supplied externally. There is no need to follow any definite order to refresh the rows, so long as each row is refreshed before the change across the capacitor drops below the minimum value representing a "1" value.

For the construction of highly integrated memory chips, the concept of DRAM is now generally accepted. Today's DRAM chips have the capacity of up to 64 megabit. With the continuing development of larger and larger memory chips, various forms of organization have been established. Some of them aim at reducing the access time and avoiding delay caused by periodical refreshing the information stored in dynamic memory. For these reasons, specifically but not exclusively, DRAM is divided into several banks. In the course of operation, each bank has to be accessible and therefore a decoding logic circuitry of a memory controller has to be provided.

In a prior art bank decoding means of DRAM controller system, a complex complementary logic is used for the decoding of each memory bank constituting a DRAM. The approximate volume of the decoding logic for $bank_{M+1}$, for example, is equal to the number of DRAM types supported in $bank_{M+1}$ multiplied by the decoding logic for $bank_M$. By DRAM types, it is meant that the decoding logic for $bank_{M+1}$ must consider all the possible conditions in $bank_0$ to $bank_M$, i.e. the last bank is the most complicated one. So if the system supports a DRAM consisting of several banks having different memory capacities, a substantially intricate logic is necessary to address the required bank in the DRAM.

FIG. 1 of the accompanying drawings exemplifies the above situation with decoding logic circuits for identifying the necessary DRAM bank. In this example, a DRAM controller supports one configuration of 4 MB in $bank_0$, 1 MB in $bank_1$ and 8 MB in $bank_2$, and another configuration of 2 MB in $bank_0$, 1 MB in $bank_1$ and 2 MB in $bank_2$. Decoding logic for $bank_2$ for the conditions mentioned is shown in FIG. 1 where more logic circuits are implied for further bank configurations.

FIG. 1 shows the conventional method of decoding in which the decoding process of $bank_2$ must consider all possible combinations of $bank_0$, $bank_1$ and $bank_2$. In a conventional DRAM controller, only two to four banks can be controlled. In a modern DRAM controller, more than eight DRAM banks must be controlled. It is therefore very difficult to implement a conventional decoding method in such a modern DRAM controller.

In FIG. 1, A[n:20] stand for the address bits in terms of MBs. That is, the first 20 bits of the address will define one megablock of memory. Therefore, A[n:20]=0 ... 000101 stands for the fifth megablock.

Consider the upper branch of FIG. 1. If $bank_0$ has a size of 4 MB, addressed physically by 0, 1, 2, and 3; and $bank_1$, has a size of one MB addressed physically by a value 4, then the $bank_2$ of a size of 8 MB will have addresses 5, 6, 7, 8, 9, 10, 11, and 12. The first AND gate will take care of block address 5. The second AND gate takes care of the two blocks with addresses 6 and 7. The third AND gate will take the next four blocks, 8, 9, 10, and 11. Finally, the last AND gate will address the block number 12.

Consider now the lower branch of FIG. 1. If $bank_0$ is 2 MB covering the addresses 0 and 1 and $bank_1$ is 1 MB covering address 2, then $bank_2$ with 2 MB size is addressed by the two addresses 3 and 4. This is shown in the last AND gates.

The output of FIG. 1 will be the address of $bank_2$.

Therefore, a need exists for a simpler and cheaper bank decoding circuitry which could easily satisfy different DRAM modules configurations and provide better bank decoding timing.

It is therefore an object of the present invention to simplify the bank decoding logic and to reduce its cost.

It is another object of the present invention to provide better decoding timing.

It is a further object of the present invention to provide means easy to support any kind of configuration of DRAM modules.

SUMMARY OF THE INVENTION

These and other objects are accomplished by the present invention in which a method of a bank decoding in a DRAM controller system is disclosed comprising the steps of obtaining an access address of said bank, defining a begin address of said bank, defining an end address of said bank, comparing said begin and said end addresses with said access address, and excluding by a logic means unreal relationships between said access address and said end address, and between said access address and said begin address.

Defining the begin address of the bank is attained, according to the present invention, through adding bank sizes of all banks preceding the bank in question.

With these and other objects, advantages and features in view, the present invention will be clearly understood from the ensuing detailed description in connection with the accompanying drawings.

DETAILED DESCRIPTION OF THE INVENTION

Figure 1:
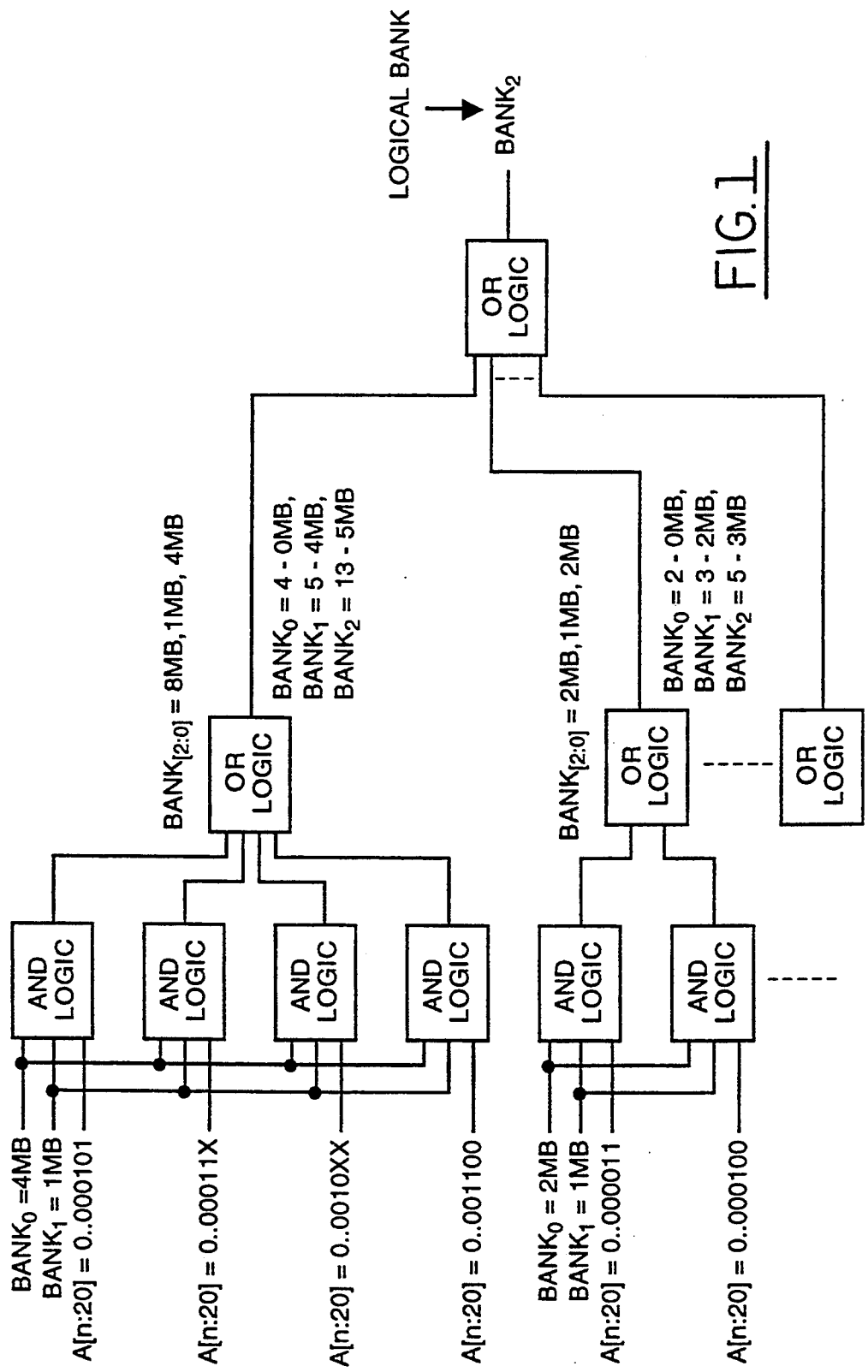
FIG. 1 is a circuit diagram of a prior art bank decoding circuit.
Figure 2:
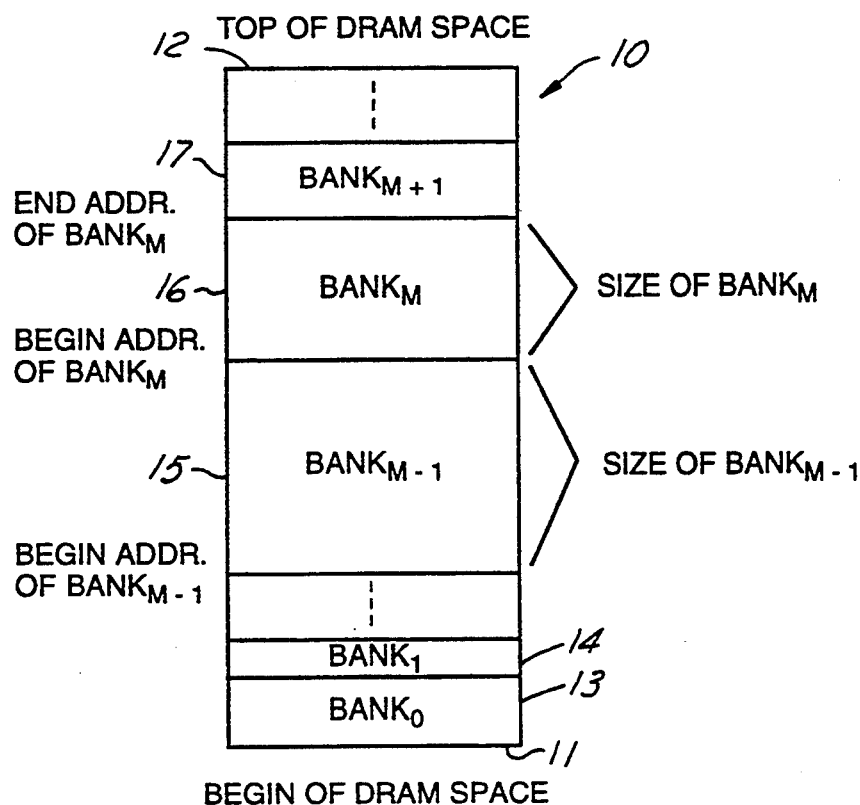
FIG. 2 is an address range map of a DRAM organized in the form of banks.

Referring now to FIG. 2, the DRAM space 10 starts at 11. The last address of $bank_0$ is physically the address before the start of $bank_1$. However, we defined the end address to be the address after the last address. That is, the end address of $bank_0$ is the starting address of $bank_1$. This terminology will make it easier to obtain the size of $bank_0$ by subtracting the starting address of $bank_0$ from the end address of $bank_0$. Space 13 is $bank_0$. Space 14 is $bank_1$. Space 15 is an arbitrary $bank_{M-1}$. Space 16 is the $bank_M$. Space 17 is $bank_{M+1}$. Finally the last bank within the DRAM space is labeled as Space 12.

In general, the starting address of $bank_M$ is the same as the end address of $bank_{M-1}$. Similarly the starting address of $bank_{M+1}$ is the source as the end address of $bank_M$.

The idea of the present invention is to decode each DRAM bank using three parameters only. They are a begin address of the current bank, an end address or memory size of the current bank, and an access address. As it can be seen from FIG. 2, the following relationship is valid for all the banks provided that in terms of the sequence of the addresses each successive bank is an immediate continuation of the preceding one:

Begin address of $Bank_M$
= End address of $Bank_{M-1}$
= Begin address of $Bank_{M-1}$ + size of $Bank_{M-1}$
= Begin address of $Bank_{M-2}$ (not shown) + size of $Bank_{M-2}$ + size of $Bank_{M-1}$
..........
= Begin address of $Bank_1$ + size of $Bank_1$ + ... + size of $Bank_{M-2}$ + size of $Bank_{M-1}$
= Begin address of $Bank_0$ + size of $Bank_0$ + size of $Bank_1$ + ... + size of $Bank_{M-2}$ + size of $Bank_{M-1}$
= size of $Bank_0$ + size of $Bank_1$ + ... + size of $Bank_{M-2}$ + size of $Bank_{M-1}$ if the Begin address A[n:20] of $Bank_0$ were 0 ... 0000000 b.

The above relationship shows that the information necessary for decoding the current bank, irrespective of a DRAM configuration, can be uniquely expressed if reduced to a begin address. Using software or hardware, one can calculate it according to the accumulating result of the size of each and every preceding bank.

A rule can be formulated based on the above relationship:

"Begin address of Bank$_M$ ≦ Access address < End address of Bank$_M$", or in other words:

"Begin address of Bank$_M$ ≦ Access address < Begin address of Bank$_M$ + size of Bank$_M$".

Then, the only thing the decoder needs to do is to compare an access address with begin and end addresses of Bank$_M$.

Figure 3:
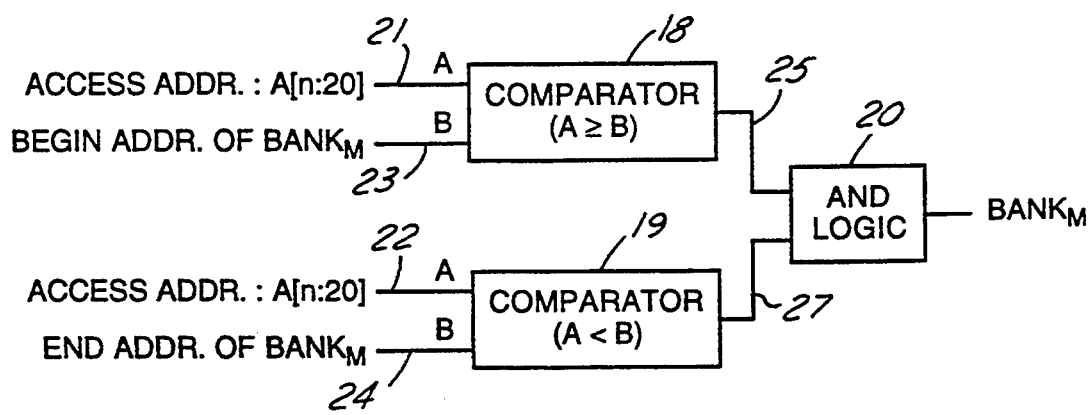
FIG. 3 is a structural diagram illustrating the principle of the present invention by an example.

A structural diagram shown in FIG. 3 illustrates an embodiment of the present invention. Two comparators 18 and 19 and an AND logic gate 20 constitute a decoding structure for bank$_M$ with an access address entering input 21 of comparator 18 (A) and input 22 of comparator 19 (also A), whereas the End address of Bank$_M$ is applied to input 23 of comparator 18 (B), and the Begin address of Bank$_M$ is applied to input 24 of comparator 19 (also B). Comparator 18 dealing with the Bank$_M$ End address has its outputs 25 A≧B corresponding to a situation where the access address is greater than or equal to the Begin address, respectively,) connected to the AND gate 20, whereas the second input of the AND gate 20 which is a final link in the Bank$_M$ decoding structure is fed from an output 27 of comparator 19 dealing with the Bank$_M$ End address, corresponding to a situation of A<B, i.e. the access address is less than the End address.

For the Bank$_{[2:0]}$=8 MB, 1 MB, 4 MB configuration, the Begin address of Bank$_2$ is A[n:20]=0 . . . 0000101 b, the size of Bank$_2$ is 8 MB, so the End address of Bank$_2$ is A[n:20]=0 . . . 0001101 b.

For the Bank$_{[2:0]}$=2 MB, 1 MB, 2 MB configuration, the Begin address of Bank$_2$ is A[n:20]=0 . . . 0000011 b, the size of Bank$_2$ is 2 MB, so the End address of Bank$_2$ is A[n:20]=0 . . . 0000101 b.

For other configurations, only the Begin address and End address should be calculated, then no matter how many DRAM module configurations is supported, the decoding logic circuit is still the same as showed in FIG. 3.

The operation of determining the Begin address is not critical timing related, it can be left to software or hardware setting, thus the decoding circuit can approach the best timing.

The advantages of the new method of DRAM bank decoding areas are as follows: first, the bank decoding logic is simplified and its cost is reduced, secondly, a better bank decoding timing is provided and thirdly, different DRAM modules configurations can be supported.

It should be understood that though the DRAM controller bank decoding in accordance with the present invention has been described in detail, it may be subjected to modifications and other embodiments incorporating the inventive features. Accordingly, it is intended that the foregoing disclosure is to be considered as illustrating the principles of the invention as an example of those features and not as a delimiting description, which is the purpose of the claims that follow:

I claim:

1. A method of a specific DRAM bank address decoding in a DRAM controller system for a DRAM consisted of banks, each of said banks being characterized by a begin address and an end address thereof, said end address of each of said banks, except for a last bank, coinciding with said begin address of an upper-adjacent bank of said banks so that a size of each of said banks is characterized by a difference between said end address and said begin address thereof, said method comprising the steps of:

obtaining an access address of said specific bank,
defining a begin address of said specific bank,
defining an end address of said specific bank,
comparing said begin and said end addresses with said access address, and
deciding that said access address belongs to said specific bank when said begin address is equal to or less than said access address and said end address is larger than said access address.

2. The method according to claim 1, wherein said defining said begin address of said specific bank comprises adding bank sizes of all banks preceding said specific bank.

3. A DRAM controller system bank decoding circuit for a DRAM consisted of banks, each of said banks being characterized by a begin address and an end address thereof, said end address of each of said banks, except for a last bank, coinciding with said begin address of an upper-adjacent bank of said banks so that a size of each of said banks is characterized by a difference between said end address and said begin address thereof, said decoding circuit comprising a first comparing means for a first comparison of an access address of a bank of said DRAM with an end address of said bank, an output of said first comparing means corresponding to the result of said first comparison when said access address is less than said end address being assigned a real status, a second comparing means for a second comparison of said access address with a begin address of said bank, an output of said second comparing means corresponding to the result of said second comparison when said access address is equal to or larger than said begin address being assigned a real status, and an AND logic means with inputs thereof being fed from said outputs of said first and said second comparing means having said real status.

* * * * *